(12) United States Patent
Yu et al.

(10) Patent No.: US 6,813,331 B1
(45) Date of Patent: Nov. 2, 2004

(54) BI-DIRECTIONAL SHIFT-REGISTER CIRCUIT

(75) Inventors: Jian-Shen Yu, Hsinchu (TW); Shi-Hsiang Lu, Taipei (TW); Chung-Hong Kuo, Tainan (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 10/733,096

(22) Filed: Dec. 11, 2003

(30) Foreign Application Priority Data

Jun. 2, 2003 (TW) ........................................ 92114880 A

(51) Int. Cl.⁷ .............................................. G11C 19/00
(52) U.S. Cl. ............................ 377/69; 345/98; 345/100
(58) Field of Search ............................... 377/69; 345/98, 345/100

(56) References Cited

U.S. PATENT DOCUMENTS 5,363,424 A * 11/1994 Fujisawa ..................... 377/69

\* cited by examiner

*Primary Examiner*—Margaret R. Wambach
(74) *Attorney, Agent, or Firm*—Thomas, Kayden, Horstemeyer & Risley

(57) ABSTRACT

A bi-directional shift-register circuit for outputting data in different turns and reducing the power loss according to a low-voltage clock signal, a first directional signal, and a second directional signal.

12 Claims, 9 Drawing Sheets

BI-DIRECTIONAL SHIFT-REGISTER CIRCUIT

BACKGROUND OF THE INVENTION

1. Field of the Invention

The present invention relates in general to a shift-register circuit. In particular, the present invention relates to a bi-directional shift-register circuit for driving a liquid crystal display.

2. Description of the Related Art

A frame of a liquid crystal display (LCD) is generated by a plurality of pixels arranged in an array. Sequential pulses are basic signals for driving the LCD. Sequential pulses are generated by a shift-register circuit, thus, the shift register circuit is a general unit for driving an LCD circuit.

A single scanning turn along one direction, however, does not satisfy all requirements of an LCD product. For example, some digital camera displays are rotated according to the placement angle of the camera. Additionally, some LCD monitors included a monitor rotating function hence LCD displays capable of multiple scanning turns are required. Thus, a shift-register circuit with multiple signal output turns is also required.

In addition, the power consumption of a transmission line is proportional to the amplitude of the signal thereon.

The power loss of the transmission line is obtained as follow:

$$P=fcv^2;$$

wherein P is power loss of the transmission line, f is a frequency, c is a parasitic capacitance of the transmission line, and v is the voltage difference of a clock signal.

Therefore, the conventional shift-register circuit requires a relatively high voltage clock supply, which induces high power consumption.

SUMMARY OF THE INVENTION

The object of the present invention is to provide a bi-directional shift-register circuit capable of operating with a low-voltage clock signal supply to reduce power consumption required by clock signal transmission.

According to the above-mentioned objects, the present invention provides a bi-directional shift-register circuit for outputting data in different turns according to a low-voltage clock signal, a first directional signal, and a second directional signal. The bi-directional shift-register circuit comprises a plurality of shift-register units coupled to a first bi-directional control circuit. Each shift-register unit has a level shifter and an input, an output terminal and a clock input terminal for receiving the low-voltage clock signal. The first bi-directional control circuit is coupled to the first-stage output terminal, the third-stage output terminal and the first directional signal or second directional signal, wherein the first bi-directional control circuit outputs the signal of the first-stage output terminal to the second-stage input terminal when the first bi-directional control circuit receives the first directional signal, and outputs the signal of the third-stage output terminal to the second-stage input terminal when the first bi-directional control circuit receives the second directional signal.

In addition, the present invention provides another bi-directional shift-register circuit comprising thin film transistors for outputting data in different turns according to a low-voltage clock signal, a first directional signal, and a second directional signal. The bi-directional shift-register circuit comprises a plurality of shift-register units that is coupled to a first bi-directional control circuit. Each of the shift-register units has a level shifter and an input, an output terminal and a clock input terminal for receiving the low-voltage clock signal. The first bi-directional control circuit is coupled to the first-stage output terminal, the third-stage output terminal and the first directional signal or second directional signal, wherein the first bi-directional control circuit outputs the signal of the first-stage output terminal to the second-stage first input terminal and outputs the signal of the third-stage output terminal to the second-stage second input terminal when the first bi-directional control circuit receives the first directional signal, and outputs the signal of the third-stage output terminal to the second-stage first input terminal and outputs the signal of the first-stage output terminal to the second-stage second input terminal when the first bi-directional control circuit receives the second directional signal.

BRIEF DESCRIPTION OF THE DRAWINGS

The present invention can be more fully understood by reading the subsequent detailed description and examples with reference made to the accompanying drawings, wherein.

DETAILED DESCRIPTION OF THE INVENTION

Figure 1:
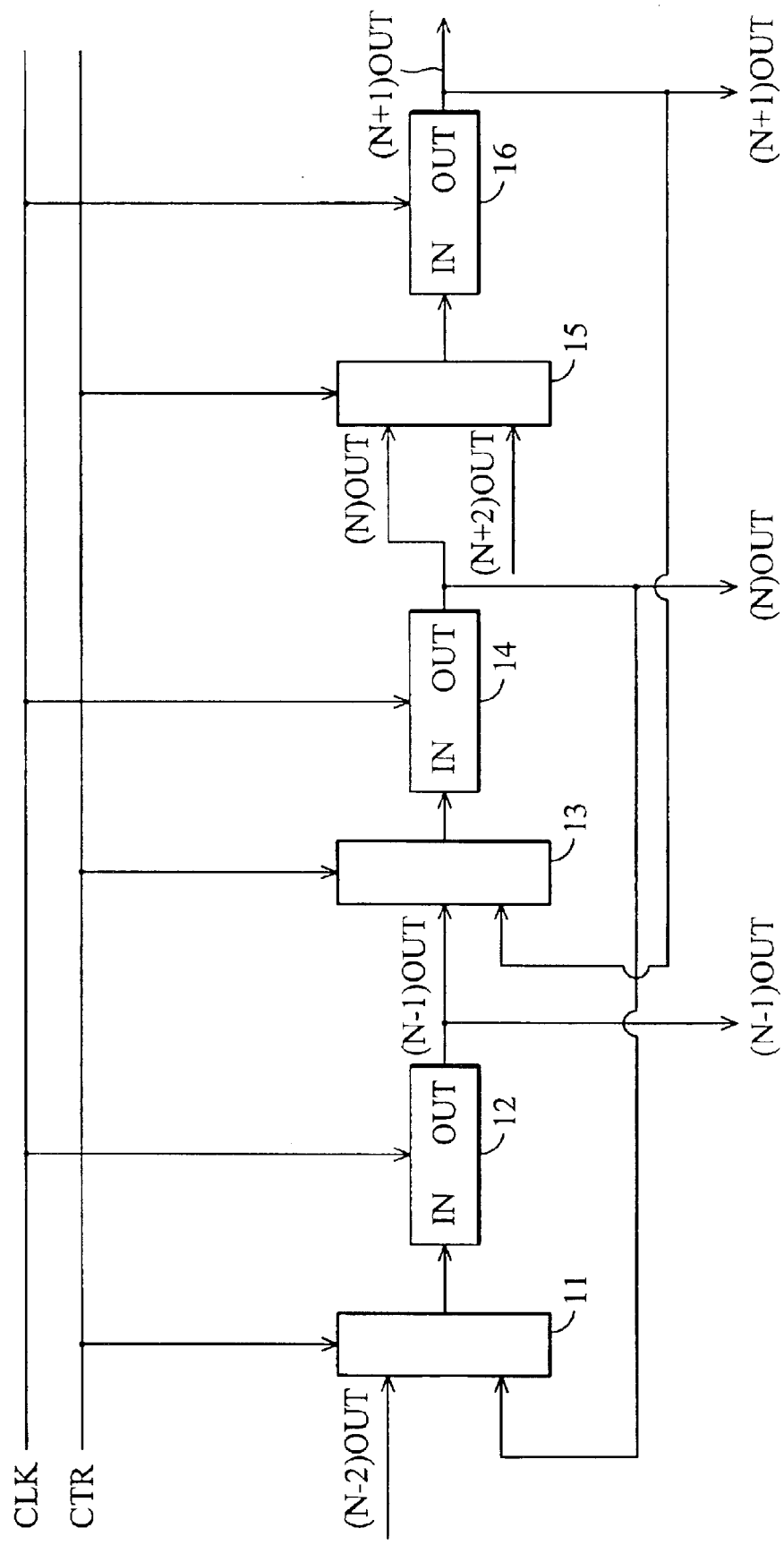
FIG. 1 shows a block diagram of the bi-directional shift-register circuit according to the first embodiment of the present invention.

FIG. 1 shows a block diagram of the bi-directional shift-register circuit according to the first embodiment of the present invention. Only three stages of shift-register units are shown in FIG. 1, and a plurality of shift-register units constitute a shift-register circuit. In the present invention, each shift-register unit has a bi-directional control circuit to switch data output turns and directions of the shift-register units.

In FIG. 1, the input signals of the (N−1)th-stage shift-register unit 12 is the output signal (N−2)OUT of the (N−2)th-stage shift-register unit or the output signal (N)OUT of the (N)th-stage shift-register unit 14 output by the bi-directional control circuit 11. The input signals of the (N)th-stage shift-register unit 14 is the output signal (N−1) OUT of the (N−1)th-stage shift-register unit 12 or the output signal (N+1)OUT of the (N+1)th-stage shift-register unit 16 output by the bi-directional control circuit 13. The input signals of the (N+1)th-stage shift-register unit 16 is the output signal (N)OUT of the (N)th-stage shift-register unit 14 or the output signal (N+2)OUT of the (N+2)th-stage shift-register unit output by the bi-directional control circuit 15. Each shift-register unit comprises a clock input terminal for receiving a clock signal CLK.

For example, the (N)th-stage shift-register unit 14 receives the output signal (N−1)OUT of the (N−1)th-stage shift-register unit 12 or the output signal (N+1)OUT of the (N+1)th-stage shift-register unit 16 through the bi-directional control circuit 13. The shift-register circuit outputs signals in turns of the (N−1)th-stage shift-register unit, the (N)th-stage shift-register unit and the (N+1)th-stage shift-register unit when the data input terminal IN of the (N)th-stage shift-register unit 14 receives the output signal (N−1)OUT of the (N−1)th-stage shift-register unit 12. Conversely, the shift-register circuit outputs signals in turns of the (N+1)th-stage shift-register unit, the (N)th-stage shift-register unit and the (N−1)th-stage shift-register unit when the data input terminal IN of the (N)th-stage shift-register unit 14 receives the output signal (N+1)OUT of the (N+1)th-stage shift-register unit.

The bi-directional control circuit selectively provides data to the data input terminals of the shift-register unit according to the control signal CTR. The control signal CTR is a first directional signal or second directional signal. The shift-register circuit outputs signal in turns of the (N−1)th-stage shift-register unit, the (N) th-stage shift-register unit, and the (N+1)th-stage shift-register unit when the control signal CTR is the first directional signal. The shift-register circuit outputs signal in turns of the (N+1)th-stage shift-register unit, the (N) th-stage shift-register unit, and the (N−1)th-stage shift-register unit when the control signal CTR is the second directional signal.

Figure 2A:
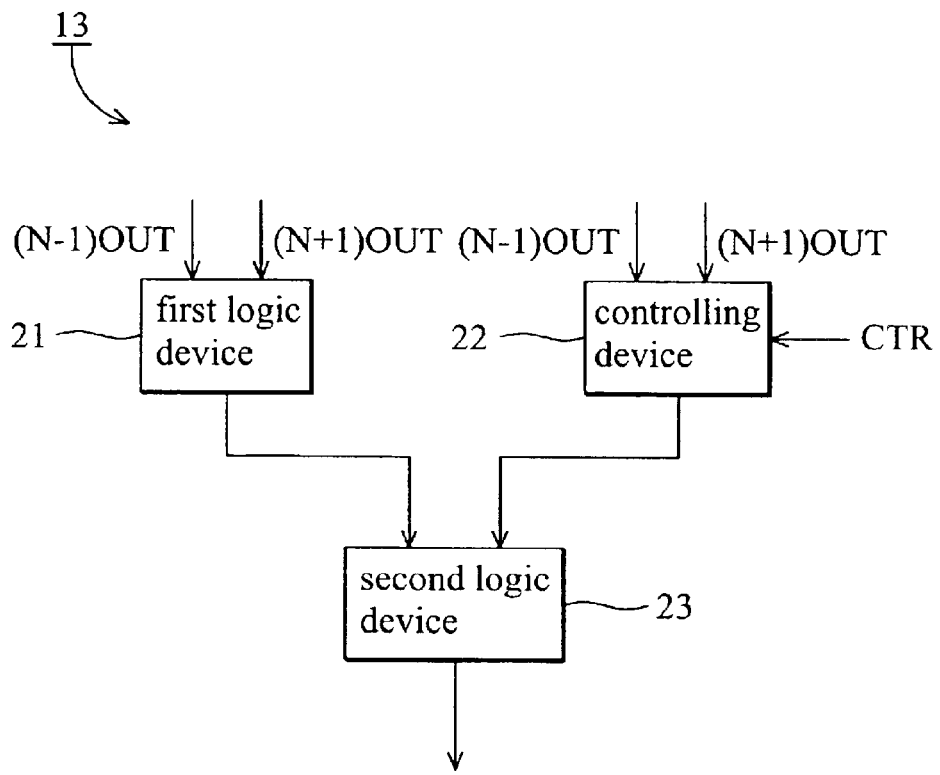
FIG. 2a shows a block diagram of the bi-directional control circuit according to the first embodiment of the present invention.
Figure 2B:
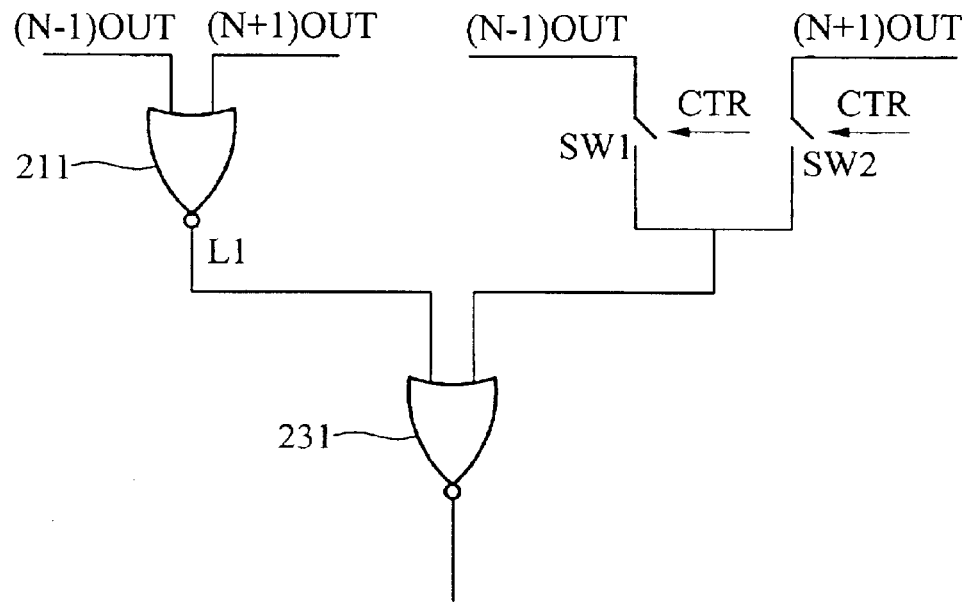
FIG. 2b shows a circuit diagram of the bi-directional control circuit according to the first embodiment of the present invention.

FIG. 2a shows a block diagram of the bi-directional control circuit according to the first embodiment of the present invention. The bi-directional control circuit 13 is described, and the other bi-directional control circuit comprises the same circuit except for the received signals. The bi-directional control circuit comprises a first logic device 21, a controlling device 22 and a second logic device 23. FIG. 2b shows a circuit diagram of the bi-directional control circuit according to the first embodiment of the present invention. The first logic device 21 is a NOR logic gate 211. The second logic device 23 is a NOR logic gate 231. The controlling device 23 comprises two switching devices SW1 and SW2.

The NOR logic gate 211 receives the output signal (N−1)OUT of the (N−1)th-stage shift-register unit 12 and the output signal (N+1)OUT of the (N+1)th-stage shift-register unit 16. The NOR logic gate 211 receives a high voltage level signal output from the (N−1)th-stage shift-register unit 12 and a low voltage level signal output from the (N+1)th-stage shift-register unit 16 when the control signal CTR is the first directional signal. Thus, the switching device SW2 is turned on and the NOR logic device 231 outputs the output signal of the (N−1)th-stage shift-register unit 12 to the (N)th-stage shift-register unit 14.

The NOR logic gate 211 receives a low voltage level signal output from the (N−1)th-stage shift-register unit 12 and a high voltage level signal output from the (N+1)th-stage shift-register unit 16 when the control signal CTR is the second directional signal. Thus, the switching device SW1 is turned on and the NOR logic device 231 outputs the output signal of the (N+1)th-stage shift-register unit 16 to the (N)th-stage shift-register unit 14.

Figure 3A:
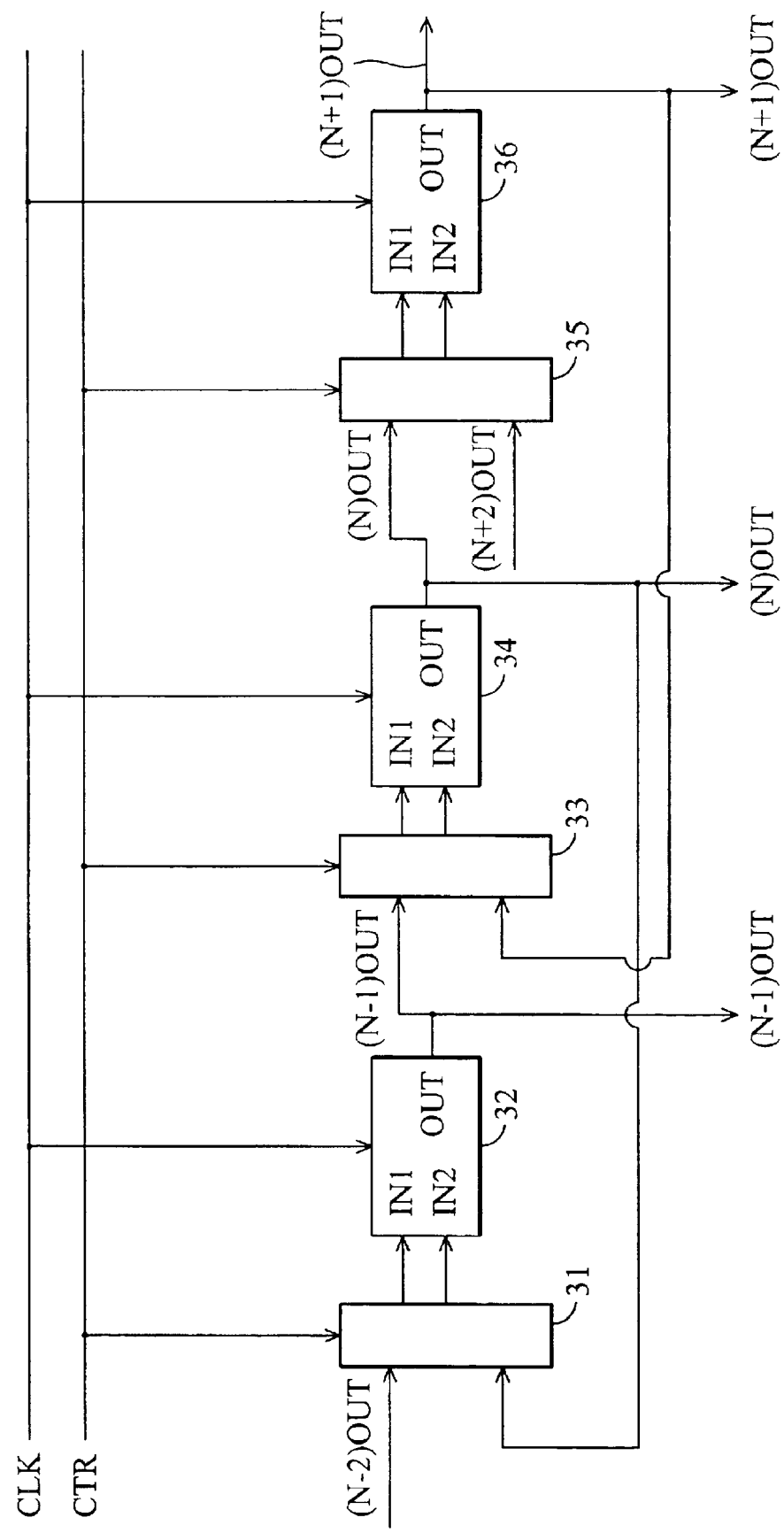
FIG. 3a shows a block diagram of the bi-directional shift-register circuit according to the second embodiment of the present invention.

FIG. 3a shows a circuit of the bi-directional shift-register circuit according to the second embodiment of the present invention. In FIG. 3, the input signals of the (N−1)th-stage shift-register unit 32 are the output signal (N−2)OUT of the (N−2)th-stage shift-register unit and the output signal (N)OUT of the (N)th-stage shift-register unit 34 output by the bi-directional control circuit 31. The input signals of the (N)th-stage shift-register unit 34 are the output signal (N−1) OUT of the (N−1)th-stage shift-register unit 32 and the output signal (N+1)OUT of the (N+1)th-stage shift-register unit 36 output by the bi-directional control circuit 33. The input signals of the (N+1)th-stage shift-register unit 36 are the output signal (N)OUT of the (N)th-stage shift-register unit 34 and the output signal (N+2)OUT of the (N+2)th-stage shift-register unit output by the bi-directional control circuit 35. Each shift-register unit comprises a clock input terminal for receiving a clock signal CLK.

For example, the (N)th-stage shift-register unit 34 receives the output signal (N−1)OUT of the (N−1)th-stage shift-register unit 32 and the output signal (N+1)OUT of the (N+1)th-stage shift-register unit 36 through the bi-directional control circuit 33. The shift-register circuit outputs signal in turns of the (N−1)th-stage shift-register unit, the (N)th-stage shift-register unit and the (N+1)th-stage shift-register unit when the data input terminal IN1 receives the output signal (N−1)OUT of the (N−1)th-stage shift-register unit 32 and the data input terminal IN2 receives the output signal (N+1)OUT of the (N+1)th-stage shift-register unit 36. Conversely, the shift-register circuit outputs signal in turns of the (N+1)th-stage shift-register unit, the (N)th-stage shift-register unit and the (N−1)th-stage shift-register unit when the data input terminal IN1 receives the output signal (N+1)OUT of the (N+1)th-stage shift-register unit 36 and the data input terminal IN2 receives the output signal (N−1)OUT of the (N−1)th-stage shift-register unit 32.

The bi-directional control circuit selectively provides data to the data input terminals of the shift-register unit according to the control signal CTR. The control signal CTR is the first directional signal or second directional signal. The shift-register circuit outputs signal in turns of the (N−1)th-stage shift-register unit, the (N) th-stage shift-register unit, and the (N+1)th-stage shift-register unit when the control signal CTR is the first directional signal. The shift-register circuit outputs signal in turns of the (N+1)th-stage shift-register unit, the (N) th-stage shift-register unit, and the (N−1)th-stage shift-register unit when the control signal CTR is the second directional signal.

Figure 3B:
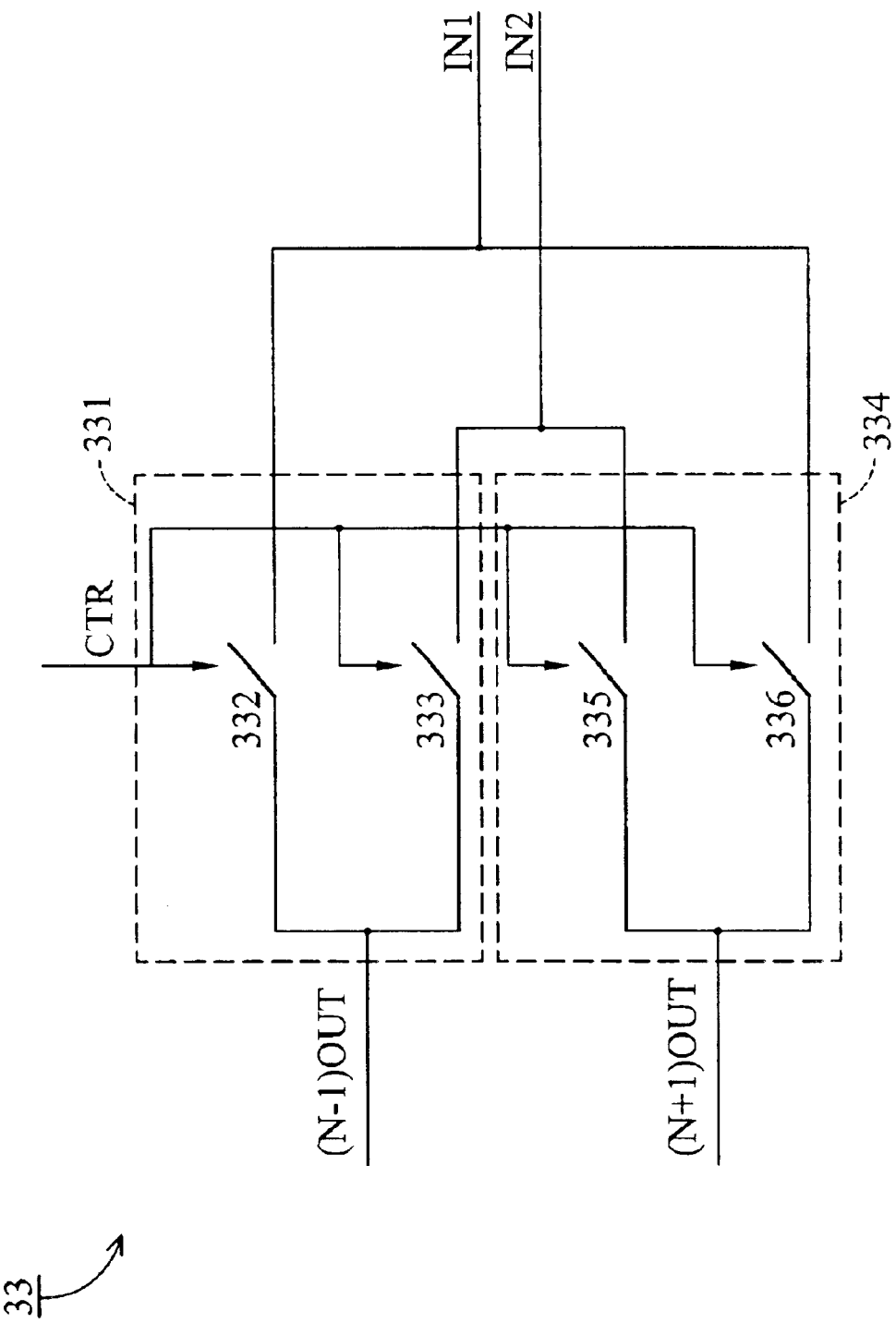
FIG. 3b shows a block diagram of the bi-directional control circuit according to the second embodiment of the present invention.

FIG. 3b a shows block diagram of the bi-directional control circuit according to the second embodiment of the present invention. The bi-directional control circuit 33 is described, and the other bi-directional control circuit comprises the same circuit except for the received signals. The bi-directional control circuit comprises two controlling device 331 and 334. The switching devices 332 and 335 are turned on when the controlling devices 331 and 334 receive the first directional signal. Thus, the data input terminal IN1 of the (N)th-stage shift-register unit 34 receives the output signal (N−1)OUT of the (N−1)th-stage shift-register unit 32 and the data input terminal IN2 of the (N)th-stage shift-register unit 34 receives the output signal (N+1)OUT of the (N+1)th-stage shift-register unit 36. The switching device 333 and 336 are turned on when the controlling device 331 and 334 receive the second directional signal. Thus, the data input terminal IN1 of the (N)th-stage shift-register unit 34 receives the output signal (N+1)OUT of the (N+1)th-stage shift-register unit 36 and the data input terminal IN2 of the (N)th-stage shift-register unit 34 receives the output signal (N−1)OUT of the (N−1)th-stage shift-register unit 32.

Figure 4:
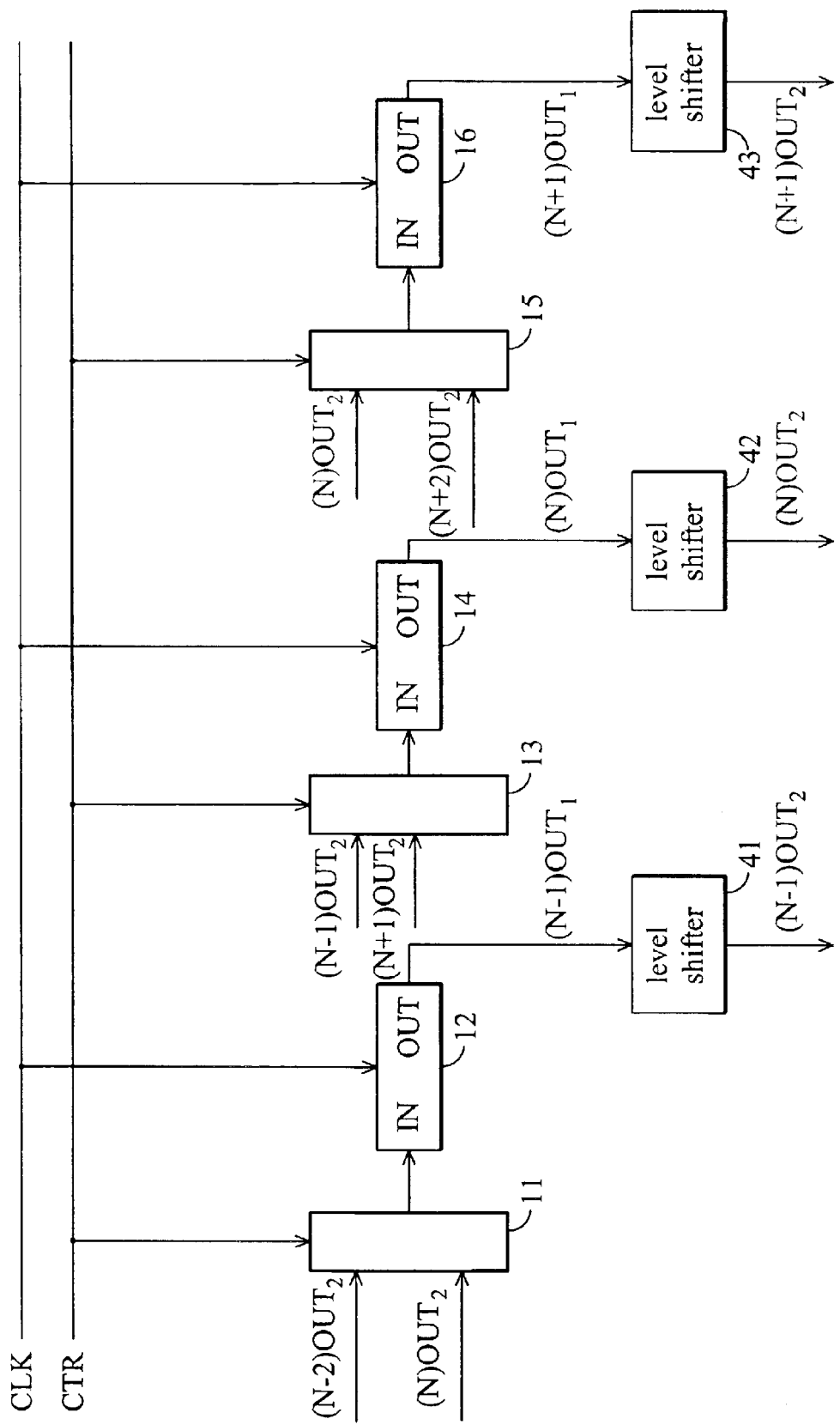
FIG. 4 shows the bi-directional shift-register circuit using the level shifters according to the first embodiment of the invention.

FIG. 4 shows the bi-directional shift-register circuit using the level shifters according to the first embodiment of the invention. For the sake of clarity, only three stages are exemplified. The level shifter 41 is coupled to the output signal (N−1)OUT$_1$ of the (N−1)th-stage shift-register unit 12 to amplify the output signal (N−1)OUT$_1$, of the (N−1)th-stage shift-register unit 12 to form an output signal (N−1)OUT$_2$ of the level shifter 41. The level shifter 42 is coupled to the output signal (N)OUT$_1$ of the (N)th-stage shift-register unit 14 to amplify the output signal (N)OUT$_1$, of the (N)th-stage shift-register unit 14 to form a output signal (N)OUT$_2$ of the level shifter 42. The level shifter 43 is coupled to the output signal (N+1)OUT$_1$ of the (N+1)th-stage shift-register unit 16 to amplify the output signal (N+1)OUT$_1$ of the (N+1)th-stage shift-register unit 16 to form an output signal (N+1)OUT$_2$ of the level shifter 43.

The bi-directional control circuit receives the output signal of the level shifter. For example, the bi-directional control circuit 13 receives the output signal (N−1)OUT$_2$ of the level shifter 41 and the output signal (N+1)OUT$_2$ of the level shifter 42.

Figure 5:
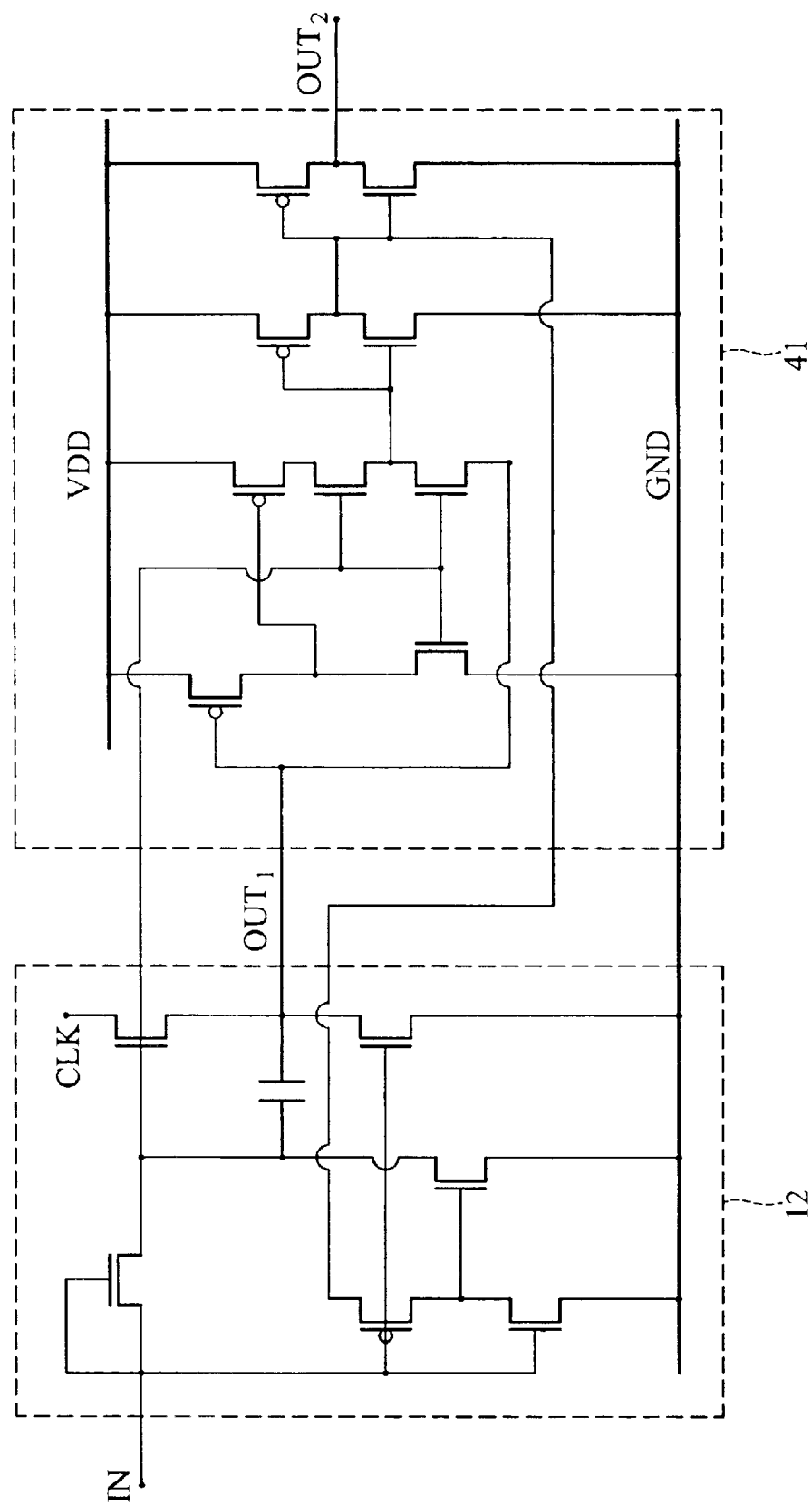
FIG. 5 shows the circuit of the level shifter and the bi-directional shift-register circuit of the FIG. 4.
Figure 6:
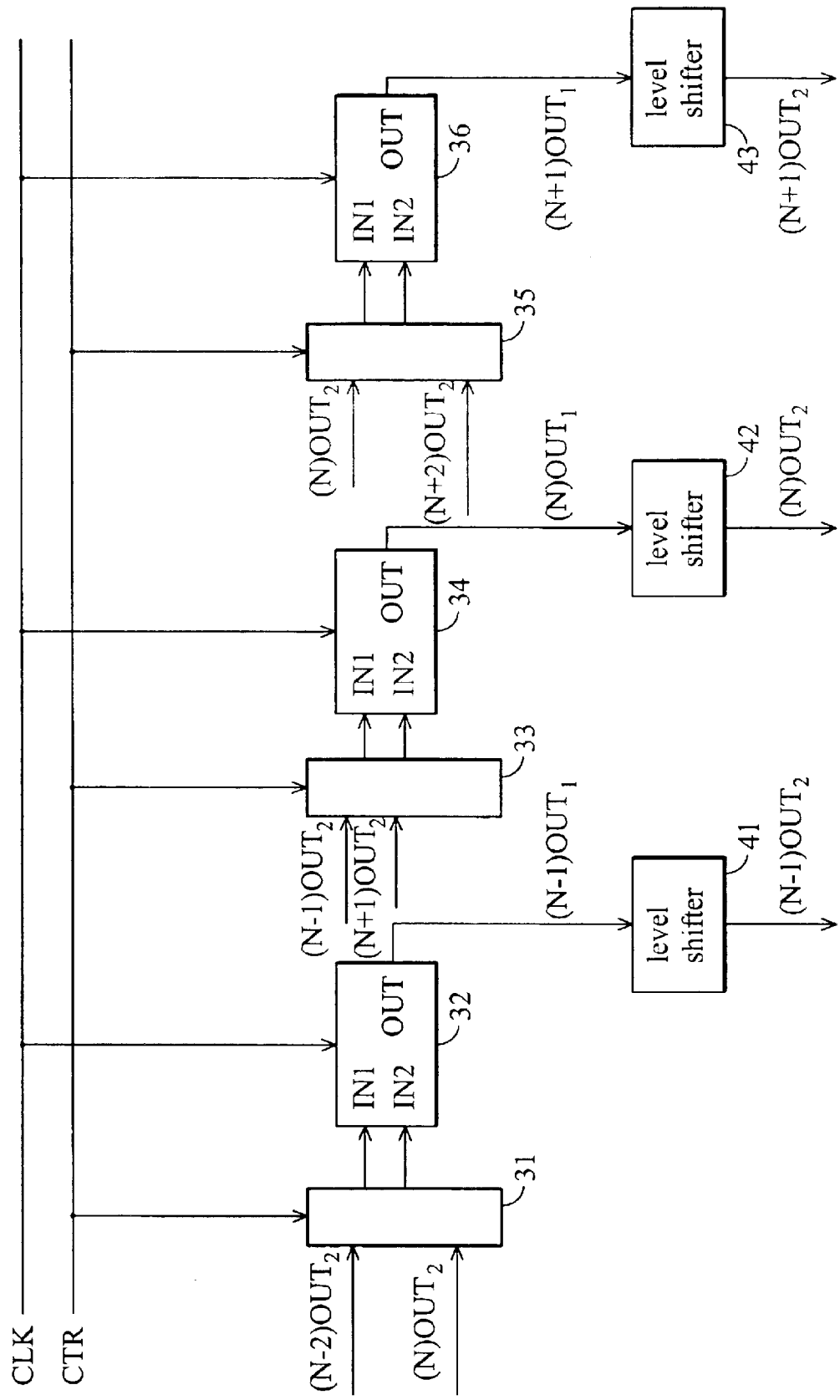
FIG. 6 shows the bi-directional shift-register circuit using the level shifters according to the second embodiment of the invention.
Figure 7:
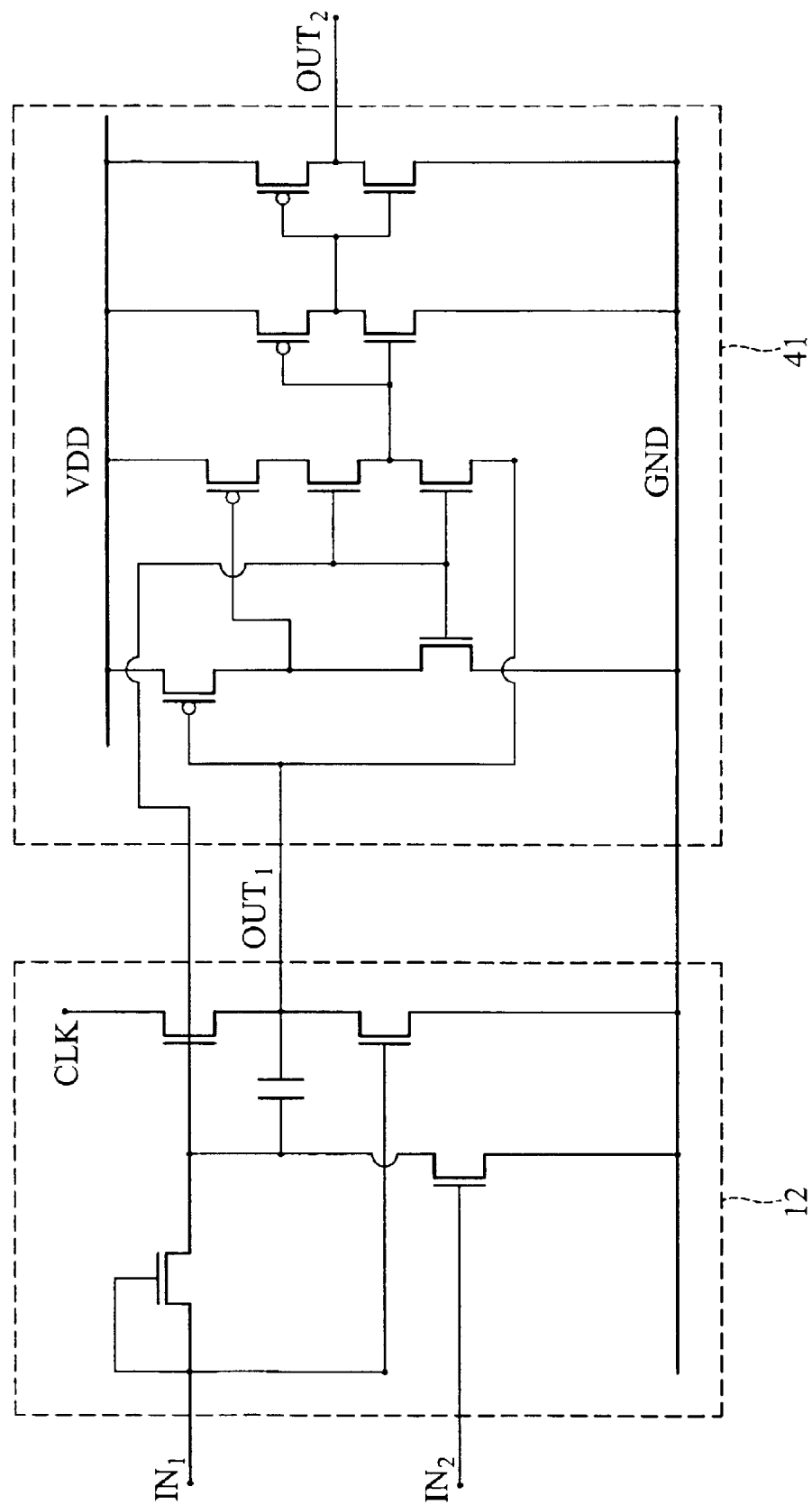
FIG. 7 shows the circuit of the level shifter and the bi-directional shift-register circuit of the FIG. 6.

FIG. 5 shows the circuit of the level shifter and the bi-directional shift-register circuit of the FIG. 4. FIG. 6 shows the bi-directional shift-register circuit using the level shifters according to the second embodiment of the invention. FIG. 7 shows the circuit of the level shifter and the bi-directional shift-register circuit of FIG. 6.

Figure 8:
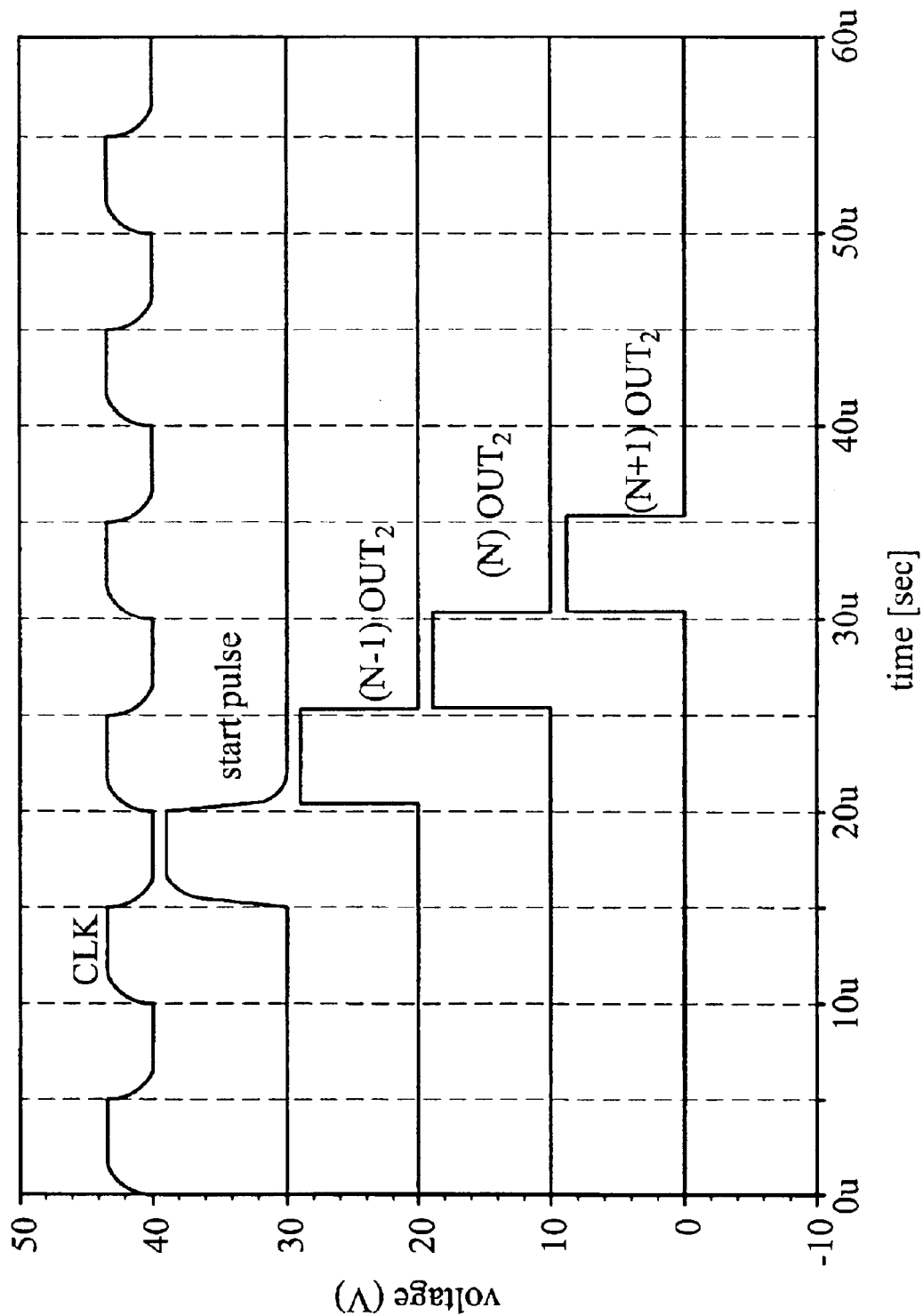
FIG. 8 is a diagram showing simulated timing of the sequential pulse trains (N−1)OUT$_2$, (N)OUT$_2$ and (N+1)OUT$_2$ according to the first and second embodiment using the level shifters.

FIG. 8 is a diagram showing simulated timing of the sequential pulse trains (N−1)OUT$_2$, (N)OUT$_2$ and (N+1)OUT$_2$ according to the first and second embodiments of using the level shifters. In this simulation, the amplitude of the clock signal is 3.3V, so the amplitude of the output signal of the level shifter is 9V.

In conclusion, the present invention provides a bi-directional shift-register circuit. Each stage of the bi-directional shift-register circuit includes a shift-register unit, bi-directional control circuit, and level shifter. The circuit configuration allows the bi-directional shift-register circuit to operate with a low-voltage clock signal thus reducing power consumption in transmission of the clock signal.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A bi-directional shift-register circuit for outputting data in different turns according to a low-voltage clock signal, a first directional signal and a second directional signal, comprising:

a first shift-register unit having a first-stage input terminal, a first-stage output terminal, and a first-stage clock input terminal for receiving the low-voltage clock signal;

a second shift-register unit having a second-stage input terminal, a second-stage output terminal, and a second-stage clock input terminal for receiving the low-voltage clock signal;

a third shift-register unit having a third-stage input terminal, a third-stage output terminal and a third-stage clock input terminal for receiving the low-voltage clock signal;

a first bi-directional control circuit having a first input terminal coupled to the first-stage output terminal, a second input terminal coupled to the third-stage output terminal, and a first control terminal; the first bi-directional control circuit outputs a signal of the first-stage output terminal to the second-stage input terminal when the first control terminal receives the first directional signal and outputs a signal of the third-stage output terminal to the second-stage input terminal when the first control terminal receives the second directional signal;

a first level shifter coupled to the first-stage output terminal to amplify the signal of the first-stage output terminal;

a second level shifter coupled to the second-stage output terminal to amplify the signal of the second-stage output terminal; and a third level shifter coupled to the third-stage output terminal to amplify the signal of the third-stage output terminal;

wherein the second shift-register unit outputs the signal of the second-stage output terminal to the third-stage input terminal when the second-stage input terminal receives the signal of the first-stage output terminal and the second shift-register unit outputs the signal of the second-stage output terminal to the first-stage input terminal when the second-stage input terminal receives the signal of the third-stage output terminal.

2. The bi-directional shift-register circuit as claimed in claim 1, wherein the data is sequentially output by the first shift-register unit, the second shift-register unit and the third shift-register unit when the first control terminal receives the first directional signal.

3. The bi-directional shift-register circuit as claimed in claim 2, wherein the data is sequentially output by the third shift-register unit, the second shift-register unit and the first shift-register unit when the first control terminal receives the second directional signal.

4. The bi-directional shift-register circuit as claimed in claim 1, further comprising:

a second bi-directional control circuit having a first input terminal coupled to the second-stage output terminal, a second input terminal coupled to a first pulse signal, and a second control terminal; wherein the second bi-directional control circuit outputs the signal of the second-stage output terminal to the third-stage input terminal when the second control terminal receives the first directional signal and outputs the first clock signal to the third-stage input terminal when the second control terminal receives the second directional signal;

a third bi-directional control circuit having a first input terminal coupled to a second pulse signal, a second input terminal coupled to the second-stage output terminal, and a third control terminal; wherein the second bi-directional control circuit outputs the second clock signal to the first-stage input terminal when the third control terminal receives the first directional signal and outputs the signal of the second-stage output terminal to the first-stage input terminal when the third control terminal receives the second directional signal.

5. The bi-directional shift-register circuit as claimed in claim 1, wherein the first bi-directional control circuit comprises:

a first logic device coupled to the first-stage output terminal and the third-stage output terminal;

a controlling device for outputting the signal of the first-stage output terminal or the signal of the third-stage output terminal according to the signal of the first control terminal; and a second logic device, coupled to an output terminal of the first logic device and an output terminal of the controlling device, for outputting the signal of the first-stage output terminal to the second-stage input terminal when the first control terminal receives the first directional signal, and outputting the signal of the third-stage output terminal to the second-stage input terminal when the first control terminal receives the second directional signal.

6. The bi-directional shift-register as claimed in claim 5, wherein the first and second logic devices are NOR logic gates.

7. A bi-directional shift-register circuit for outputting data in different turns according to a low-voltage clock signal, a first directional signal and a second directional signal, comprising:

a first shift-register unit having a first-stage first input terminal, a first-stage second input terminal, a first-stage output terminal, and a first-stage clock input terminal for receiving the low-voltage clock signal;

a second shift-register unit having a second-stage first input terminal, a second-stage second input terminal, a second-stage output terminal, and a second-stage clock input terminal for receiving the low-voltage clock signal;

a third shift-register unit having a third-stage first input terminal, a third-stage second input terminal, a third-stage output terminal and a third-stage clock input terminal for receiving the low-voltage clock signal;

a first bi-directional control circuit having a first input terminal coupled to the first-stage output terminal, a second input terminal coupled to the third-stage output terminal, and a first control terminal; wherein the first bi-directional control circuit outputs a signal of the first-stage output terminal to the second-stage first input terminal, and outputs a signal of the third-stage output terminal to the second-stage second input terminal when the first control terminal receives the first directional signal and outputs the signal of the third-stage output terminal to the second-stage first input terminal and outputs the signal of the first-stage output terminal to the second-stage second input terminal when the first control terminal receives the second directional signal;

a first level shifter coupled to the first-stage output terminal to amplify the signal of the first-stage output terminal;

a second level shifter coupled to the second-stage output terminal to amplify the signal of the second-stage output terminal; and a third level shifter coupled to the third-stage output terminal to amplify the signal of the third-stage output terminal;

wherein the third-stage first input terminal receives the signal of the second-stage output terminal and the third-stage second input terminal receives a first pulse signal when the second-stage first input terminal receives the signal of the first-stage output terminal and the second-stage second input terminal receives the signal of the third-stage output terminal and the first-stage first input terminal receives the signal of the second-stage output terminal, and the first-stage second input terminal receives a second pulse signal when the second-stage first input terminal receives the signal of the third-stage output terminal and the second-stage second input terminal receives the signal of the first-stage output terminal.

8. The bi-directional shift-register circuit as claimed in claim 7, wherein the data is sequentially output by the first shift-register unit, the second shift-register unit and the third shift-register unit when the first control terminal receives the first directional signal.

9. The bi-directional shift-register circuit as claimed in claim 8, wherein the data is sequentially output by the third shift-register unit, the second shift-register unit and the first shift-register unit when the first control terminal receives the second directional signal.

10. The bi-directional shift-register circuit as claimed in claim 9, further comprising:

a second bi-directional control circuit having a first input terminal coupled to the second-stage output terminal, a second input terminal coupled to the first pulse signal, and a second control terminal; wherein the second bi-directional control circuit outputs the signal of the second-stage output terminal to the third-stage first input terminal and outputs the first clock signal to the third-stage second input terminal when the second control terminal receives the first directional signal and outputs the first clock signal to the third-stage first input terminal and outputs the signal of the second-stage output terminal to the third-stage second input terminal when the second control terminal receives the second directional signal;

a third bi-directional control circuit having a first input terminal coupled to the second pulse signal, a second input terminal coupled to the second-stage output terminal, and a third control terminal; wherein the third bi-directional control circuit outputs the second clock signal to the first-stage first input terminal and outputs the signal of the second-stage output terminal to the first-stage second input terminal when the third control terminal receives the first directional signal and outputs the signal the second-stage output terminal to the first-stage first input terminal and outputs the second clock signal to the first-stage second input terminal when the third control terminal receives the second directional signal.

11. The bi-directional shift-register circuit as claimed in claim 10, wherein the first bi-directional control circuit comprises:

a first switch, having an input terminal coupled to the first-stage output terminal, a first output terminal coupled to the second-stage first input terminal and a second output terminal coupled to the second-stage second input terminal, for outputting the signal of the first-stage output terminal to the second-stage first input terminal when the first control terminal receives the first directional signal; and a second switch, having an input terminal coupled to the third-stage output terminal, a first output terminal coupled to the second-stage second input terminal and a second output terminal coupled to the second-stage first input terminal, for outputting the signal of the third-stage output terminal to the second-stage second input terminal when the first control terminal receives the second directional signal.

12. The bi-directional shift-register circuit as claimed in claim 11, wherein the first switch outputs the signal of the first-stage output terminal to the second-stage second input terminal and the second switch outputs the signal of the third-stage output terminal to the second-stage first input terminal when the first control terminal receives the second directional signal.

* * * * *